US012489280B2

(12) United States Patent
Lin et al.

(10) Patent No.: US 12,489,280 B2
(45) Date of Patent: Dec. 2, 2025

(54) POWER SUPPLY AND WIRE SECURING ASSEMBLY THEREOF

(71) Applicant: ACBEL POLYTECH INC., New Taipei (TW)

(72) Inventors: Cheng-Chia Lin, New Taipei (TW); Yueh-Feng Li, New Taipei (TW); Yu-Hsuan Ting, New Taipei (TW); Nung-Chin Kao, New Taipei (TW); Chih-Wei Chang, New Taipei (TW)

(73) Assignee: ACBEL POLYTECH INC., New Taipei (TW)

( * ) Notice: Subject to any disclaimer, the term of this patent is extended or adjusted under 35 U.S.C. 154(b) by 169 days.

(21) Appl. No.: 18/388,196

(22) Filed: Nov. 9, 2023

(65) Prior Publication Data

US 2024/0372344 A1    Nov. 7, 2024

(30) Foreign Application Priority Data

May 4, 2023   (TW) .................................. 112204280

(51) Int. Cl.
*H05K 7/14*  (2006.01)
*H02G 3/04*  (2006.01)
*H05K 1/18*  (2006.01)

(52) U.S. Cl.
CPC ........... *H02G 3/0456* (2013.01); *H05K 1/181* (2013.01); *H05K 7/1427* (2013.01); *H05K 2201/10356* (2013.01)

(58) Field of Classification Search
CPC ....... H05K 7/1427; H05K 2201/10356; H05K 1/181
USPC ................................ 361/752, 728, 796, 800
See application file for complete search history.

(56) References Cited

U.S. PATENT DOCUMENTS

| 2010/0270439 | A1* | 10/2010 | Li | F16L 3/1075 |
| | | | | 248/65 |
| 2013/0107478 | A1* | 5/2013 | Zhou | G06F 1/186 |
| | | | | 361/759 |
| 2018/0045335 | A1* | 2/2018 | Martin | F16L 3/04 |
| 2022/0384968 | A1* | 12/2022 | Gutt | H01R 4/646 |

* cited by examiner

*Primary Examiner* — Hung S. Bui
(74) *Attorney, Agent, or Firm* — WPAT, PC

(57) ABSTRACT

A power supply has a housing, a circuit board, a wire, and a wire securing assembly. The wire securing assembly has a base plate and a securing structure. The securing structure has a first plate and a second plate. A side edge of the first plate is connected to the base plate. The second plate is spaced apart from the first plate. The wire is mounted through and between the first plate and the second plate. The wire securing assembly is modified from the current insulating part, in which the original side plate extends and forms an additional part, or a bent structure is added on the original side plate, and thus the additional structures become the securing structure. Thus, the wire is prevented from moving under vibration or external force and contacting the blades of the fan, or keeps in a position in compliance with safety requirements.

9 Claims, 23 Drawing Sheets

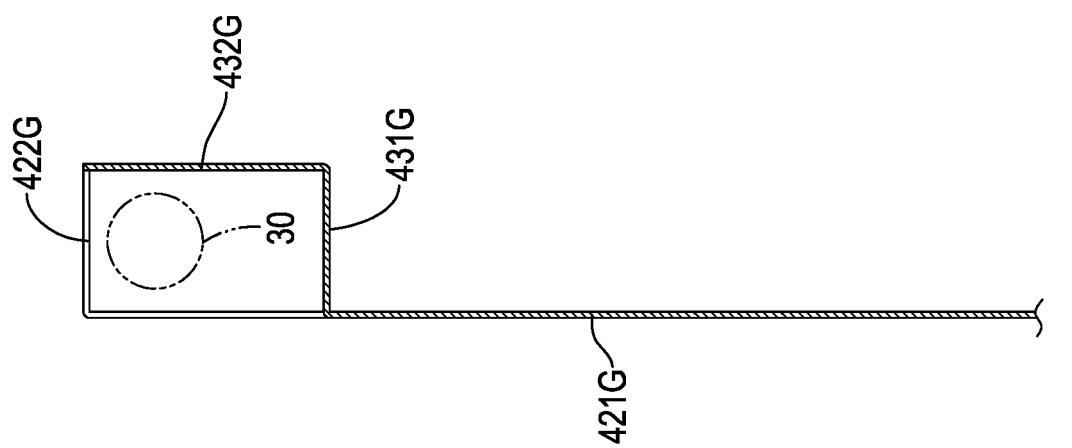

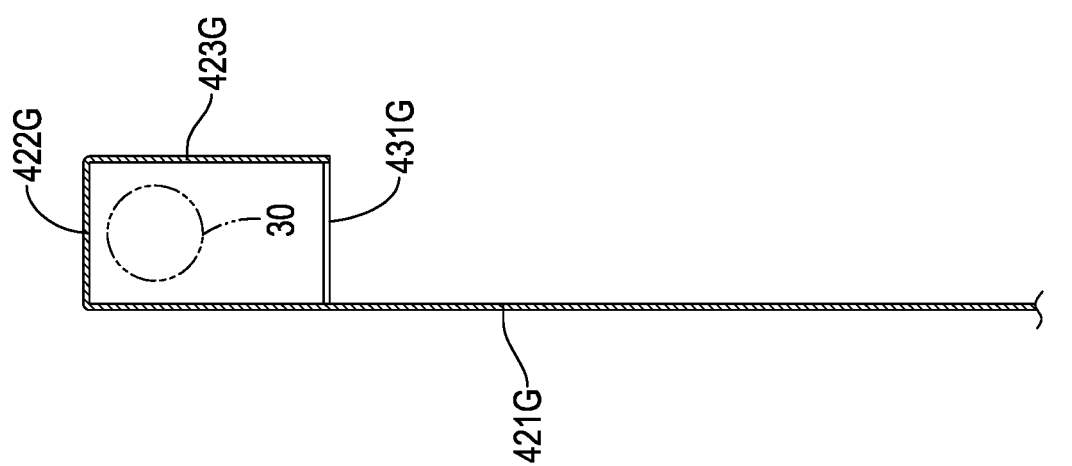

POWER SUPPLY AND WIRE SECURING ASSEMBLY THEREOF

BACKGROUND OF THE INVENTION

1. Field of the Invention

The present invention relates to a power supply, especially to a power supply and a wire securing assembly for the power supply.

2. Description of the Prior Arts

Dimensions of the current power supply become smaller and smaller, making the usable space inside insufficient. Correspondingly, dimensions of the circuit board also become smaller. As it becomes smaller, the circuit board may not have enough space for connecting wires or electric elements, so the power supply may have several small circuit boards. Therefore, the small circuit boards need to be connected via extra wires for transmitting signals and power therebetween. However, according to the safety requirements, the wire has to keep a certain distance from other elements. Since the wire is flexible, the wire may be displaced or deform after the installation process is completed. Thus, the wire cannot keep a distance from other elements as required by the safety requirements, or may even contact other elements and interfere with the operation of other elements (e.g. a fan). Besides, to protect the user, an insulating part may be arranged in the power supply. The insulating part comprises a base plate and several side plates disposed on the inner surfaces of a housing of the power supply, thus preventing the current from being conducted to the outside during leakage.

Currently, to restrict the deformation of the wire, additional fixtures may be mounted in the housing to secure the wire, but the distance is still not enough to comply with the safety requirement, or the installation is not easy. Another solution is to dispose several fixing poles made of plastic in the housing, and then fix the wire on the fixing pole. However, installing fixing poles needs extra manpower and additional manufacturing steps, and the cost is also increased. Moreover, the aforesaid two solutions occupy the space in the housing.

To overcome the shortcomings, the present invention provides a power supply and a wire securing assembly for a power supply to mitigate or obviate the aforementioned problems.

SUMMARY OF THE INVENTION

The main objective of the present invention is to provide a power supply and a wire securing assembly for the power supply that can keep the safety distance in compliance with the safety requirements and restrict the wire from being displaced and deforming, without increasing the cost.

The power supply has a housing, a circuit board, a wire, and a wire securing assembly. The wire securing assembly has an insulating part. The circuit board is securely mounted on the housing and the wire is connected to the circuit board.

In one of the embodiments, the insulating part has a base plate and a securing structure. The securing structure has a first plate and a second plate parallel to and spaced apart from the first plate. A side edge of the first plate is connected to the base plate. The wire is mounted through and between the first plate and the second plate.

In another embodiment, the insulating part has a base plate and a securing structure. The securing structure has a first plate and a second plate. The first plate includes two side edges opposite each other. One of the side edges of the first plate is connected to the base plate. The first plate includes a curved surface connected to the other side edge of the first plate. The second plate includes a curved surface, and the curved surface of the second plate is connected to the curved surface of the first plate. The wire is mounted through and between the first plate and the second plate.

Therefore, the current insulating part for bearing the circuit board and fan of the power supply is modified, the original side plate extends and forms an additional part, or a bent structure is added on the original side plate, and thus the additional structures become the securing structure for securing the wire. Therefore, the wire only can be displaced within the space enclosed by the securing structure, which prevents the wire from moving to contact the blades of the fan or keeps in a position in compliance with safety requirements.

Other objectives, advantages and novel features of the invention will become more apparent from the following detailed description when taken in conjunction with the accompanying drawings.

BRIEF DESCRIPTION OF THE DRAWINGS

FIG. 22 is a sectional view of the wire securing assembly in accordance with the eighth embodiment; and FIG. 23 is another sectional view of the wire securing assembly in accordance with the eighth embodiment.

DETAILED DESCRIPTION OF THE PREFERRED EMBODIMENTS

Figure 1:
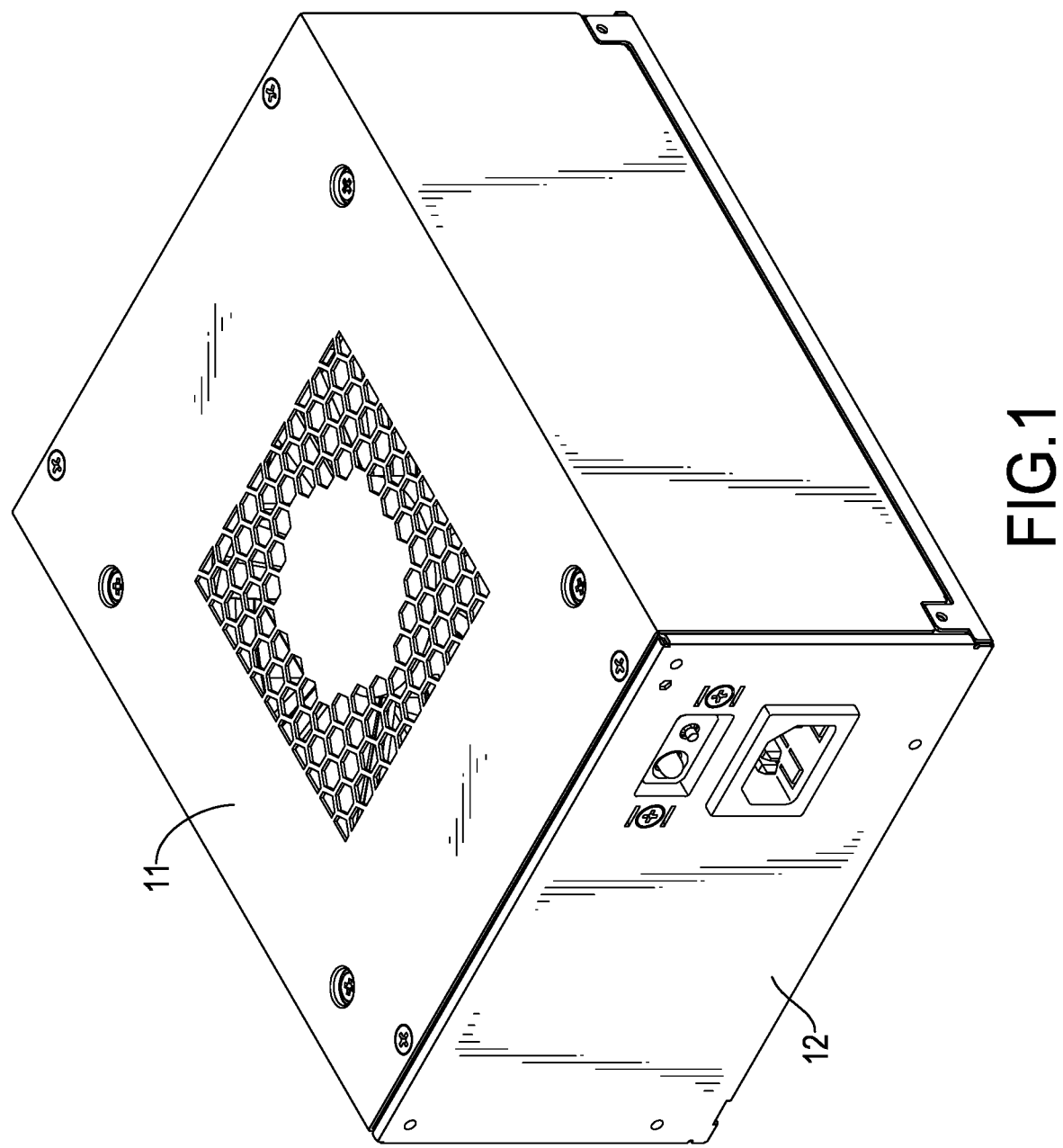
FIG. 1 is a perspective view of a power supply in accordance with the present invention.
Figure 2:
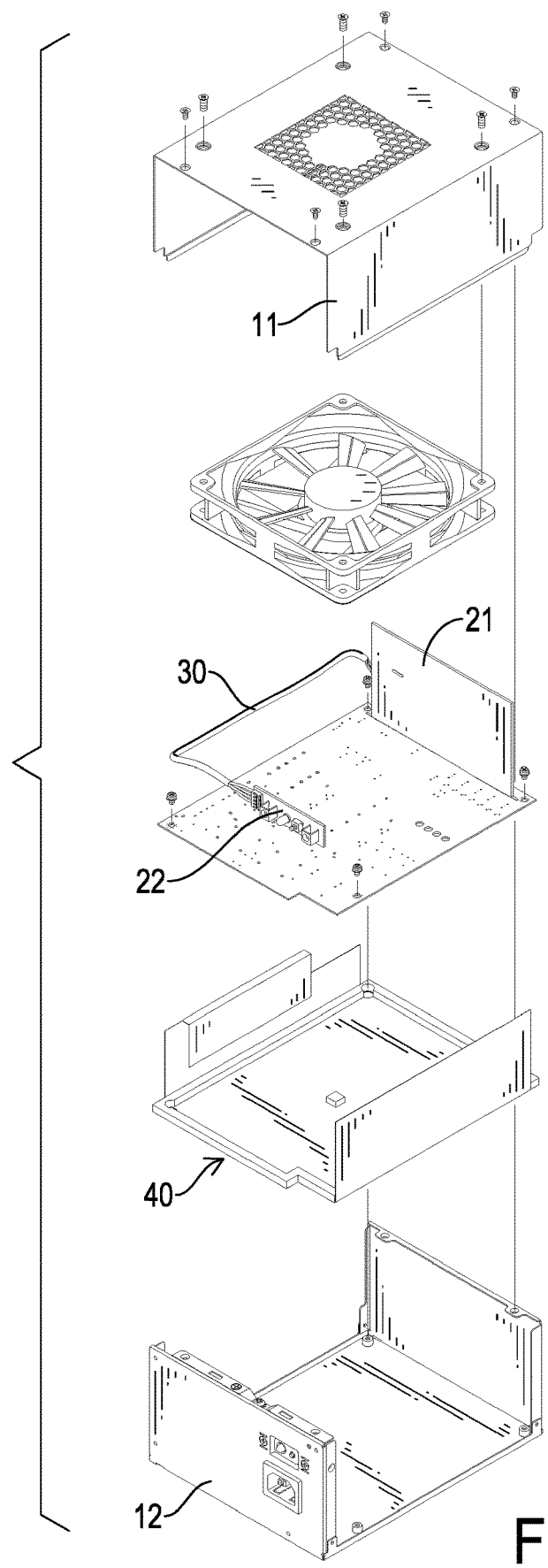
FIG. 2 is an exploded view of the power supply in FIG. 1.
Figure 3:
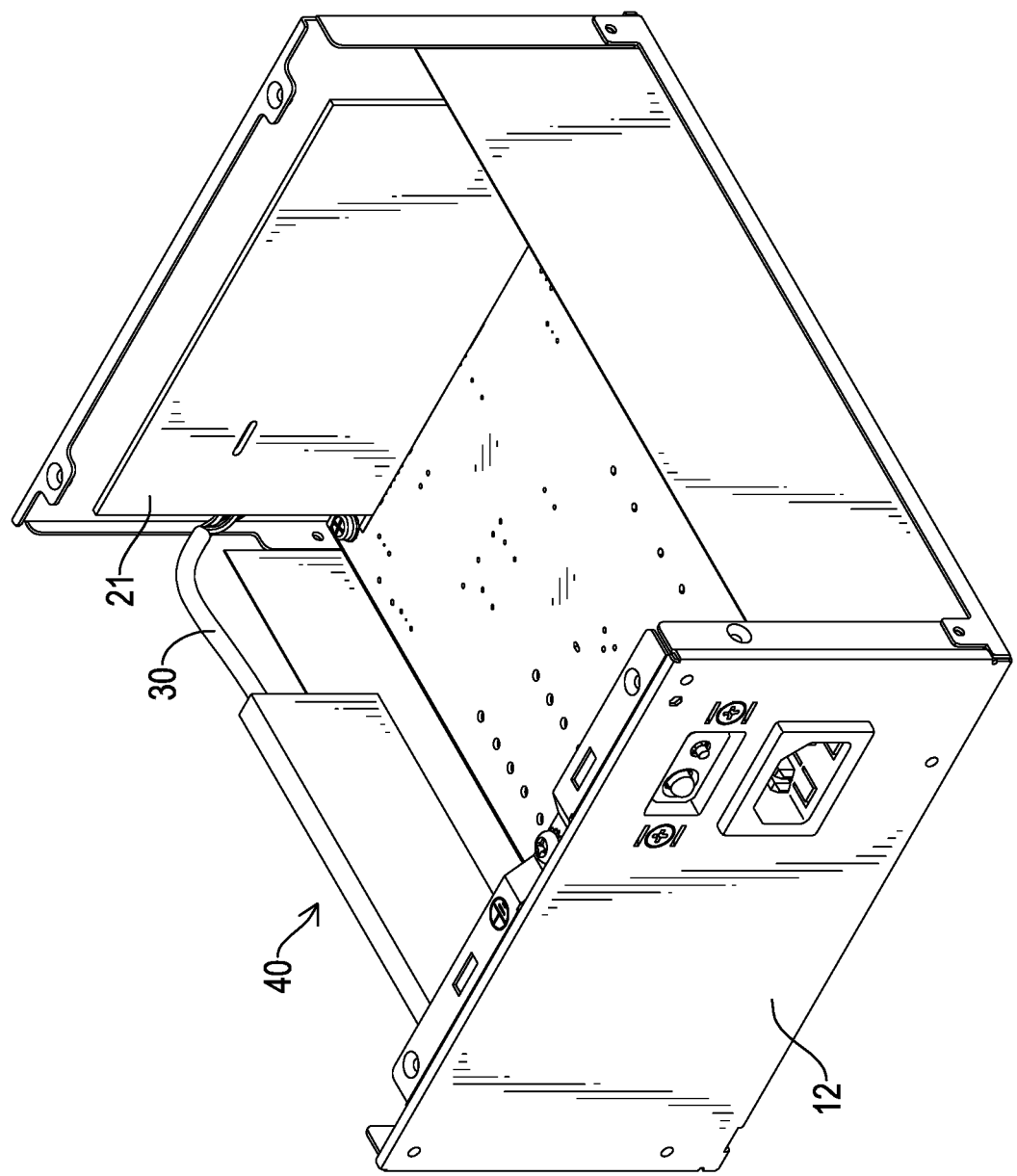
FIG. 3 is a perspective view of the power supply in FIG. 1, showing the inner structure thereof.
Figure 4:
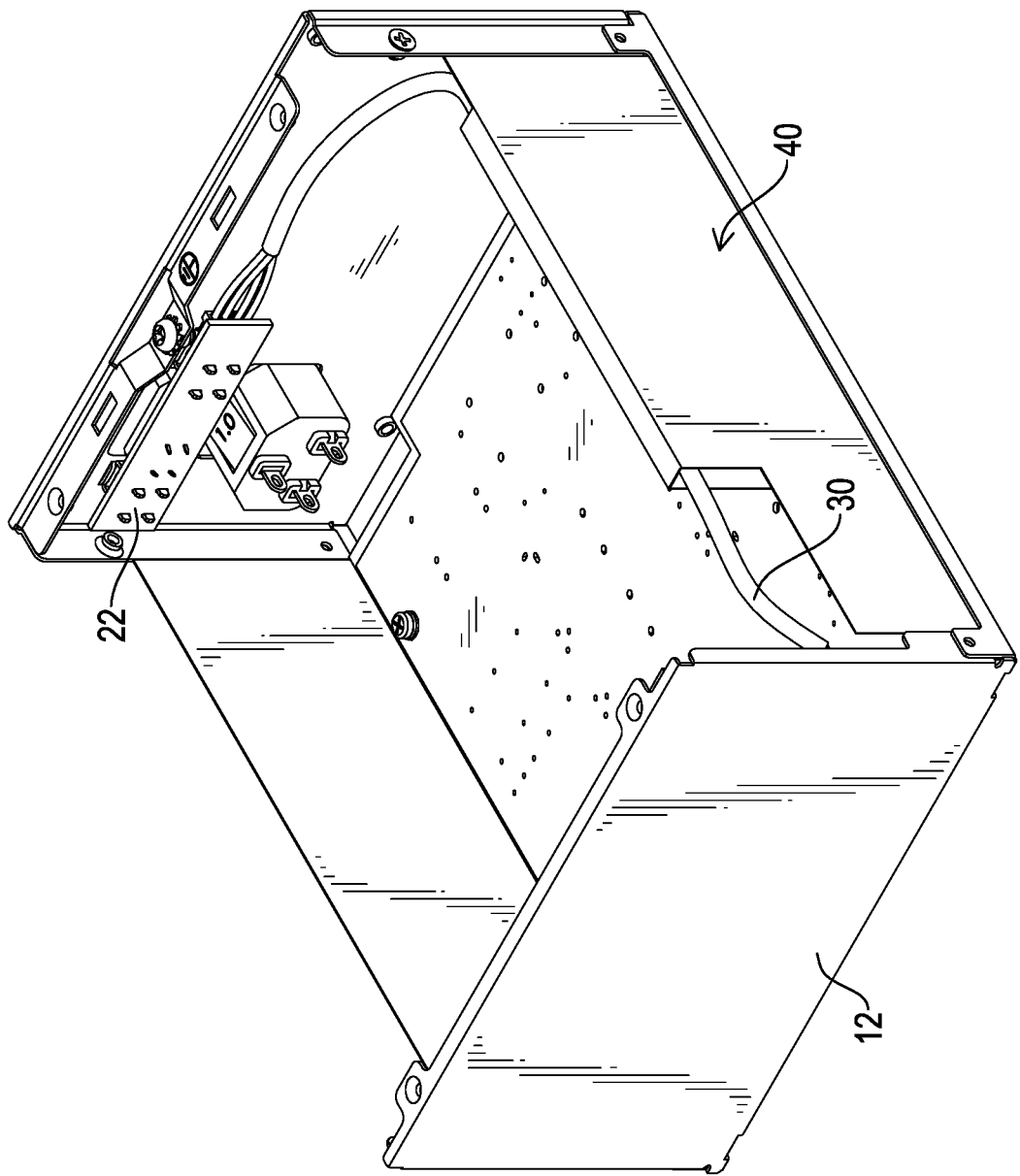
FIG. 4 is a perspective view of the power supply in FIG. 1, showing the inner structure thereof in another angle.

With reference to FIG. 1 to FIG. 4, a power supply in accordance with the present invention comprises an upper housing 11, a lower housing 12, a first circuit board 21, a second circuit board 22, a wire 30, and a wire securing assembly 40.

The lower housing 12 is securely mounted on the upper housing 11. The first circuit board 21 and the second circuit board 22 are securely mounted between the upper housing 11 and the lower housing 12. The second circuit board 22 and the first circuit board 21 are spaced apart from each other. The wire 30 connects the first circuit board 21 and the second circuit board 22.

The entire wire securing assembly 40 is like the conventional insulating part but is capable of securing the wire 30. Precisely, the insulating part of the wire securing assembly 40 comprises a base plate 41 and a securing structure 42. The base plate 41 and the securing structure 42 may be formed integrally. For example, the base plate 41 and the securing structure 42 may be made by one plate through bending or folding at different portions. The securing structure 42 may comprise a first plate 421 and a second plate 423. A side edge of the first plate 421 is connected to the base plate 41. The wire 30 is mounted through and between the first plate 421 and the second plate 423. Thus, the activity scope of the wire 30 is restricted. In this embodiment, the second plate 423 is located right above the base plate 41, so the wire 30 is restricted in an area right above the base plate 41.

Figure 5:
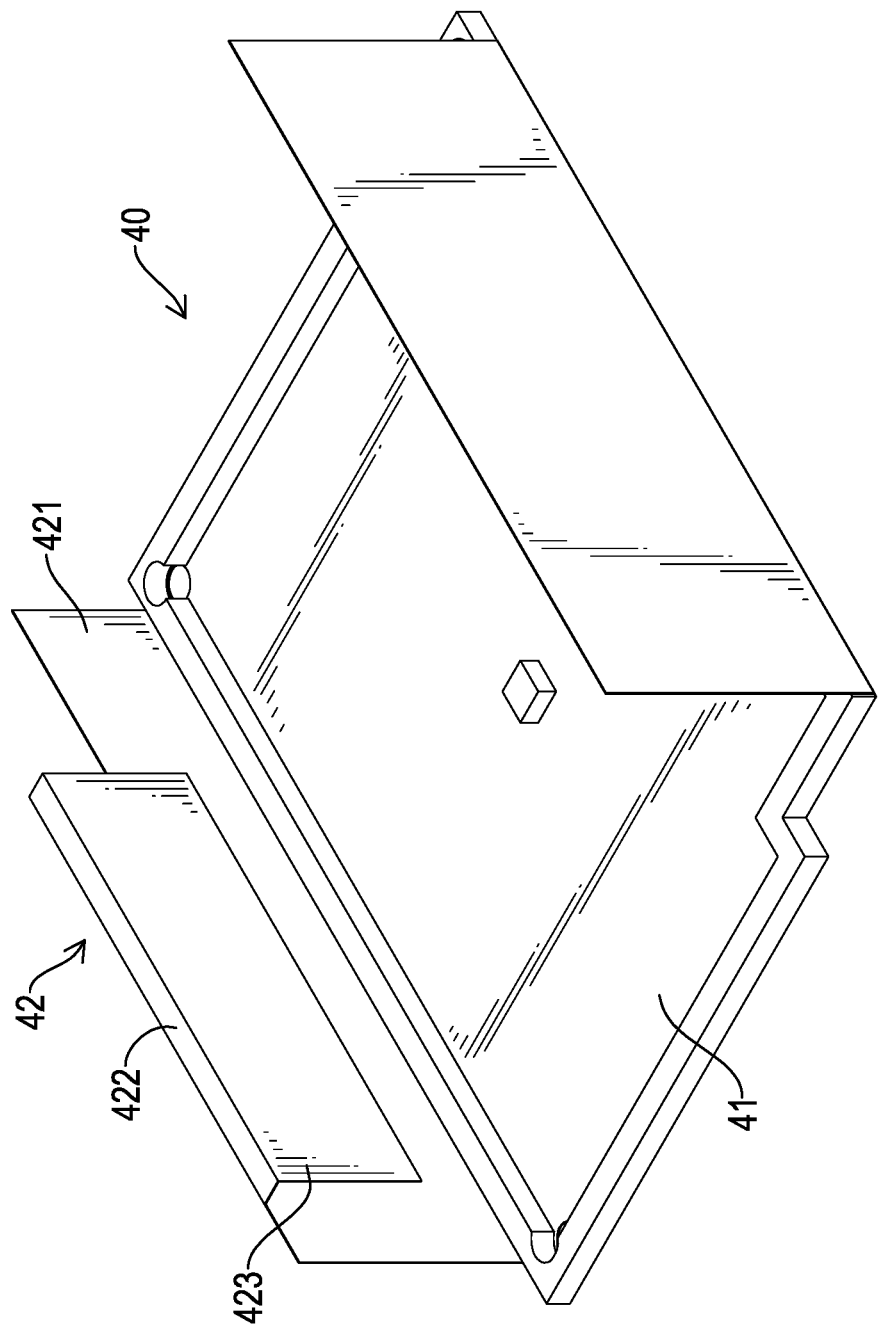
FIG. 5 is a perspective view of a wire securing assembly on the power supply in accordance with a first embodiment.
Figure 6:
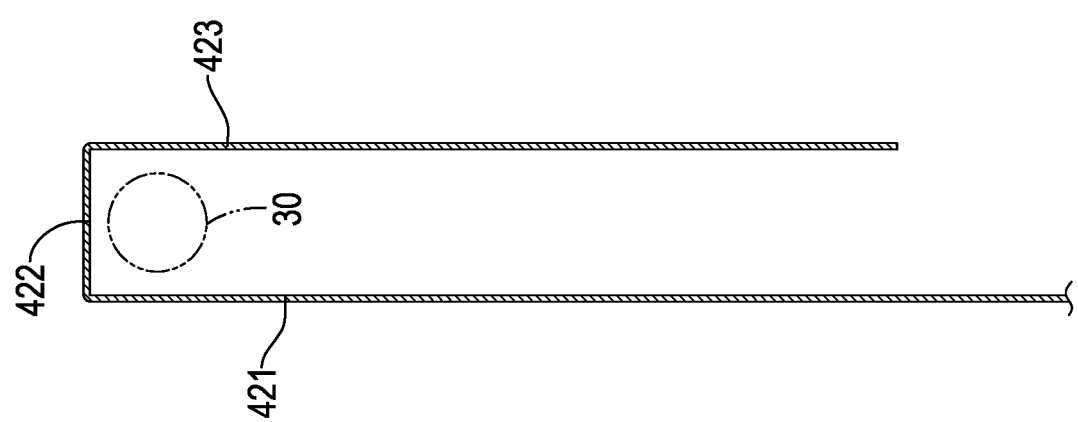
FIG. 6 is a sectional view of the wire securing assembly in accordance with the first embodiment.

Then please also refer to FIG. 5 and FIG. 6. In the first embodiment, the first plate 421 and the second plate 423 are flat, and the second plate 423 and the first plate 421 are parallel to and spaced apart from each other. Thus, a space is formed between the first plate 421 and the second plate 423 for accommodating the wire 30. Precisely, the first plate 421 comprises a first side edge and a second side edge opposite each other, and the second plate 423 comprises a third side edge and a fourth side edge opposite each other. The first side edge of the first plate 421 is connected to the base plate 41, and the second side edge of the first plate 421 is connected to the third side edge of the second plate 423.

In this embodiment, the securing structure 42 further comprises a first connecting plate 422. Two opposite side edges of the first connecting plate 422 are respectively connected to the second side edge of the first plate 421 and the third side edge of the second plate 423. The first plate 421 may be perpendicular to the base plate 41, the first connecting plate 422 may be perpendicular to the first plate 421, and the second plate 423 may be perpendicular to the first connecting plate 422. However, angles between any two of the base plate 41, the first plate 421, the first connecting plate 422, and the second plate 423 are not limited thereto.

Figure 7:
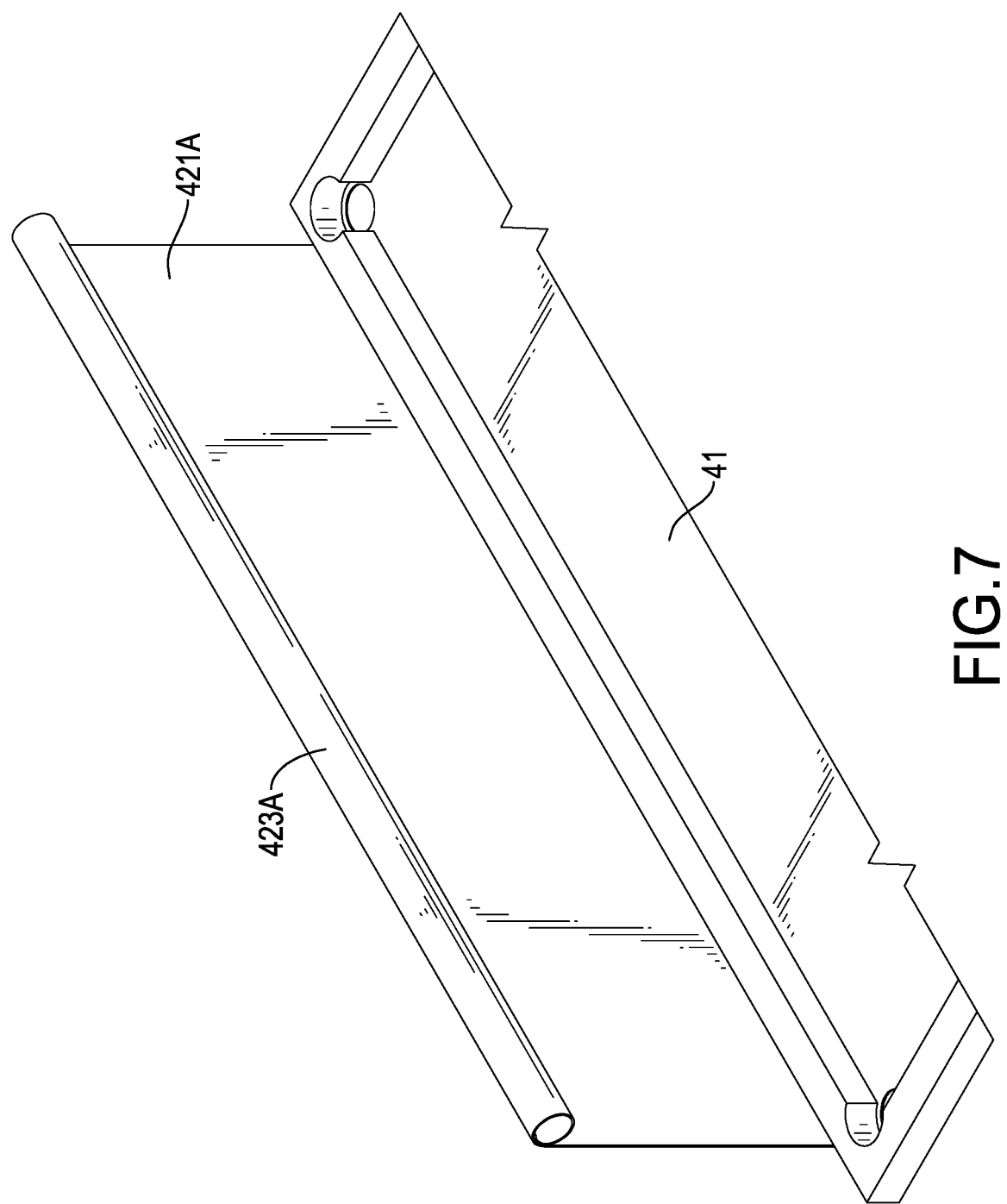
FIG. 7 is a partial perspective view of a wire securing assembly on the power supply in accordance with a second embodiment.
Figure 8:
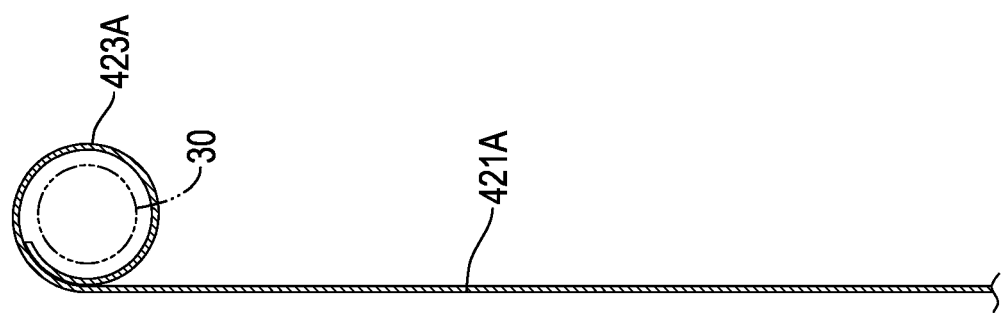
FIG. 8 is a sectional view of the wire securing assembly in accordance with the second embodiment.

Then please refer to FIG. 7 and FIG. 8. The second embodiment is similar to the first embodiment, but differences are that: in the second embodiment, the first plate 421A has two side edges opposite each other and a curved surface. One of the two side edges is connected to the base plate, and the curved surface is connected to the other side edge. The second plate 423A also includes a curved surface and the curved surface of the second plate 423A is connected to the curved surface of the first plate 421A. Thus, the curved surface of the first plate 421A and the curved surface of the second plate 423A form a tube and enclose a space for accommodating the wire 30. With such structure, the wire 30 can be mounted through and between the curved surface of the first plate 421A and the curved surface of the second plate 423A and thereby is restricted.

Figure 9:
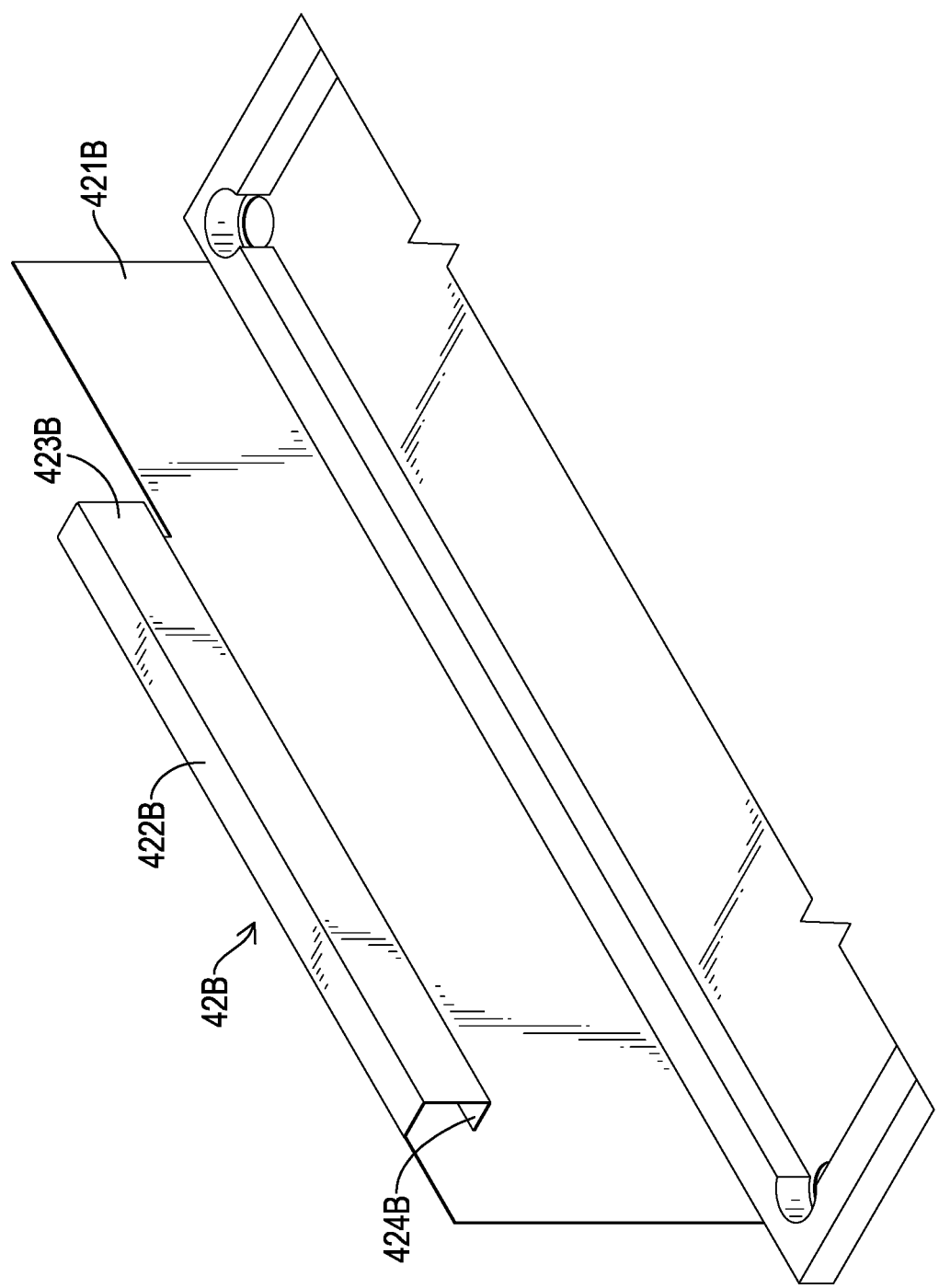
FIG. 9 is a partial perspective view of a wire securing assembly on the power supply in accordance with a third embodiment.
Figure 10:
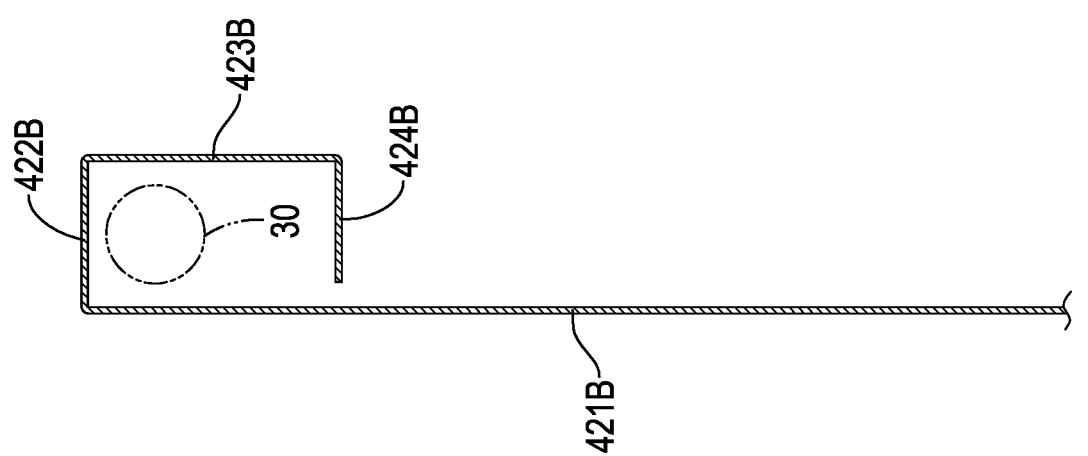
FIG. 10 is a sectional view of the wire securing assembly in accordance with the third embodiment.

Then please refer to FIG. 9 and FIG. 10. The third embodiment is similar to the first embodiment, but differences are that: in the third embodiment, the securing structure 42B further comprises a second connecting plate 424B. The second connecting plate 424B is connected to the fourth side edge of the second plate 423B. In this embodiment, the first connecting plate 422B may be parallel to and spaced apart from the second connecting plate 424B, but the angle between the first connecting plate 422B and the second connecting plate 424B is not limited thereto. With such structure, the first plate 421B, the second plate 423B, the first connecting plate 422B, and the second connecting plate 424B form and enclose a space, and the wire 30 is mounted through and between the first plate 421B, the second plate 423B, the first connecting plate 422B, and the second connecting plate 424B. In this embodiment, the first connecting plate 422B is located higher than the second connecting plate 424B, but the relative position of the first connecting plate 422B and the second connecting plate 424B is not limited thereto.

Figure 11:
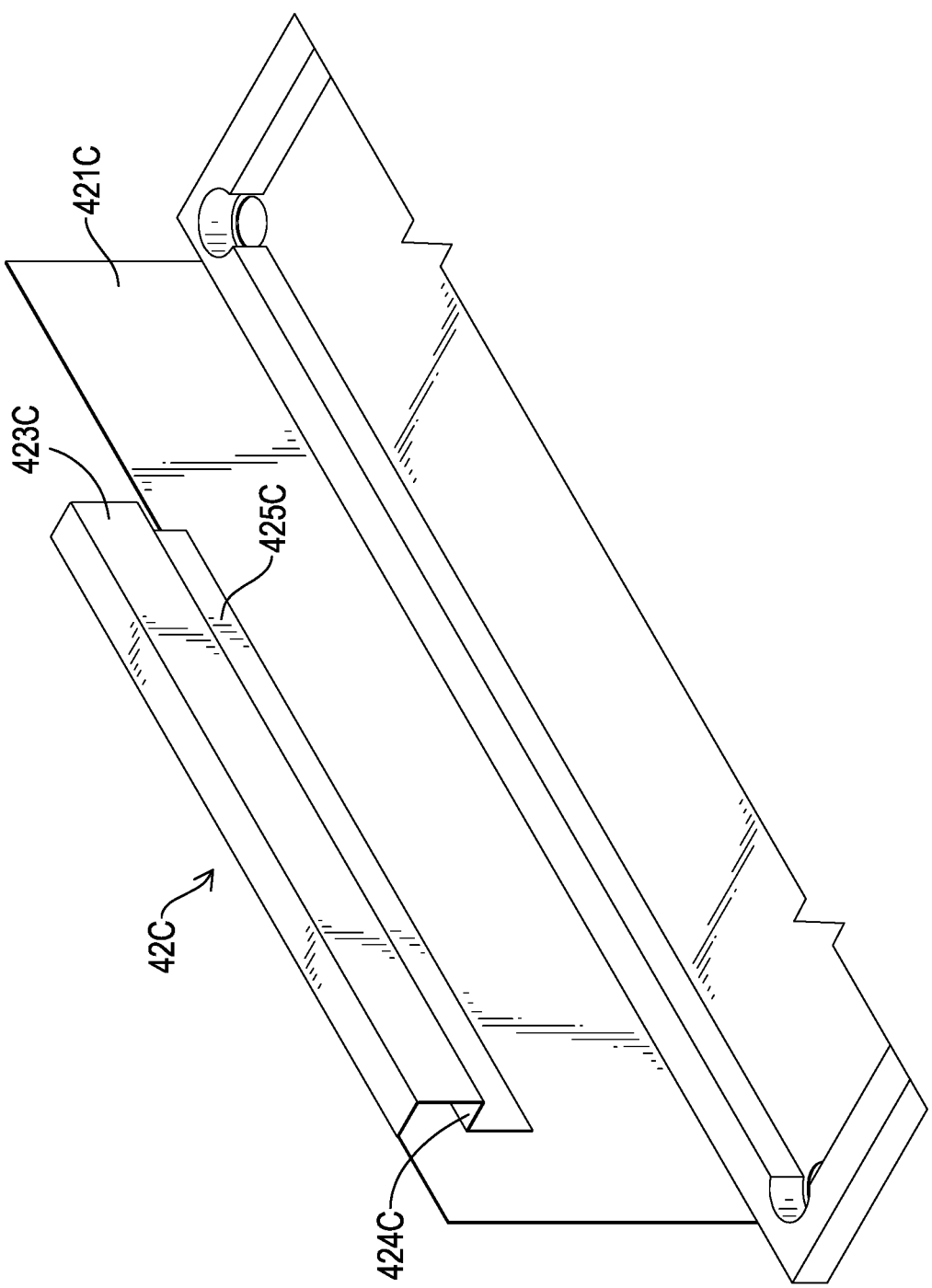
FIG. 11 is a partial perspective view of a wire securing assembly on the power supply in accordance with a fourth embodiment.
Figure 12:
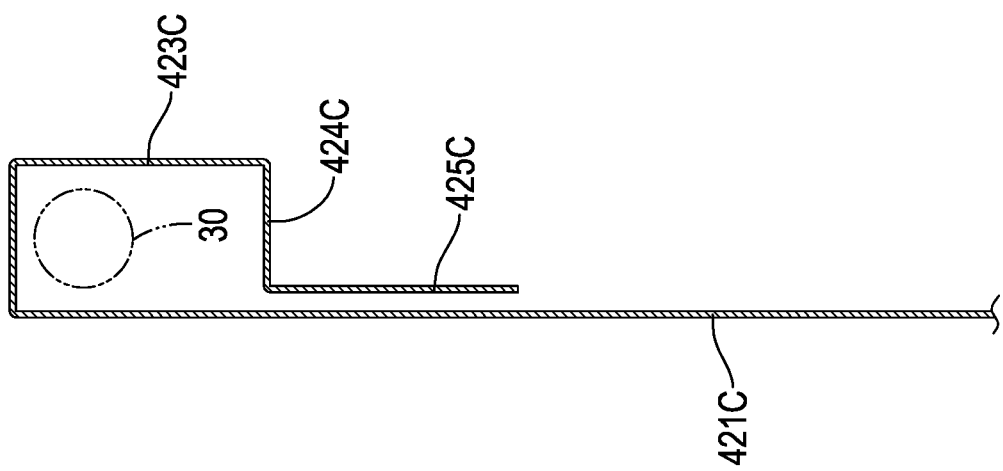
FIG. 12 is a sectional view of the wire securing assembly in accordance with the fourth embodiment.

Then please refer to FIG. 11 and FIG. 12. The fourth embodiment is similar to the third embodiment, but differences are that: in the fourth embodiment, the securing structure 42C further comprises a third plate 425C. A side edge of the third plate 425C is connected to a side edge of the second connecting plate 424C and the aforesaid side edge of the second connecting plate 424C is opposite the second plate 423C. The third plate 425C and the first plate 421C are parallel to and spaced apart from each other in this embodiment. However, the third plate 425C may be attached on the first plate 421C via welding or gluing. In other words, a distance between the third plate 425C and the first plate 421C is smaller than a distance between the second plate 423C and the first plate 421C and even is zero. The third plate 425C and the second plate 423C are located at the same side with respect to the first plate 421C. In this embodiment, a distance between the third plate 425C and the first side edge of the first plate 421C may be larger than a distance between the second plate 423C and the first side edge of the first plate 421C. With such structure, the wire 30 is prevented from detaching from the securing structure 42C and forming a gap between the third plate 425C and the first plate 421C. Or, the user is able to attach the third plate 425C on the first plate 421C.

Figure 13:
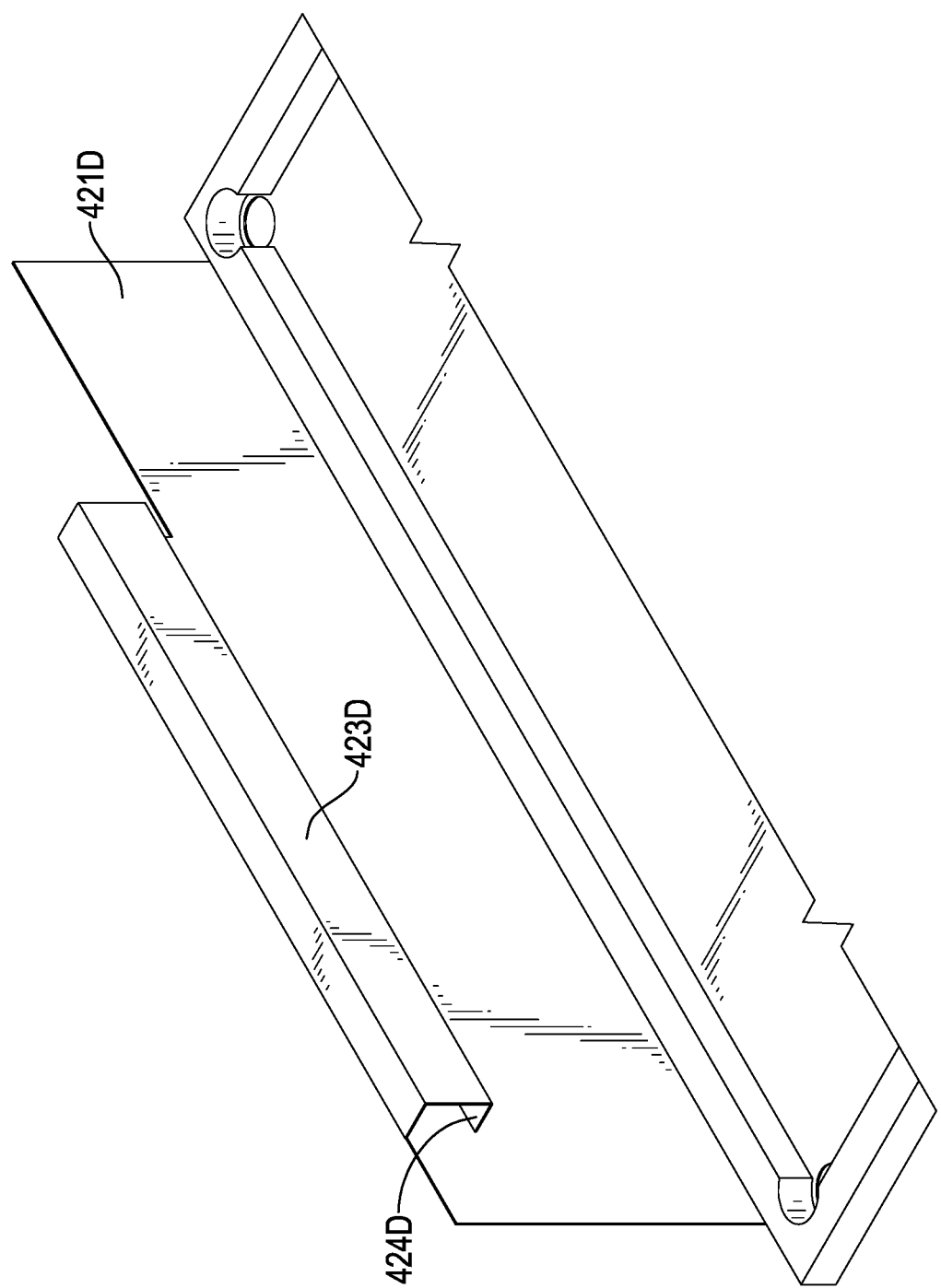
FIG. 13 is a partial perspective view of a wire securing assembly on the power supply in accordance with a fifth embodiment.
Figure 14:
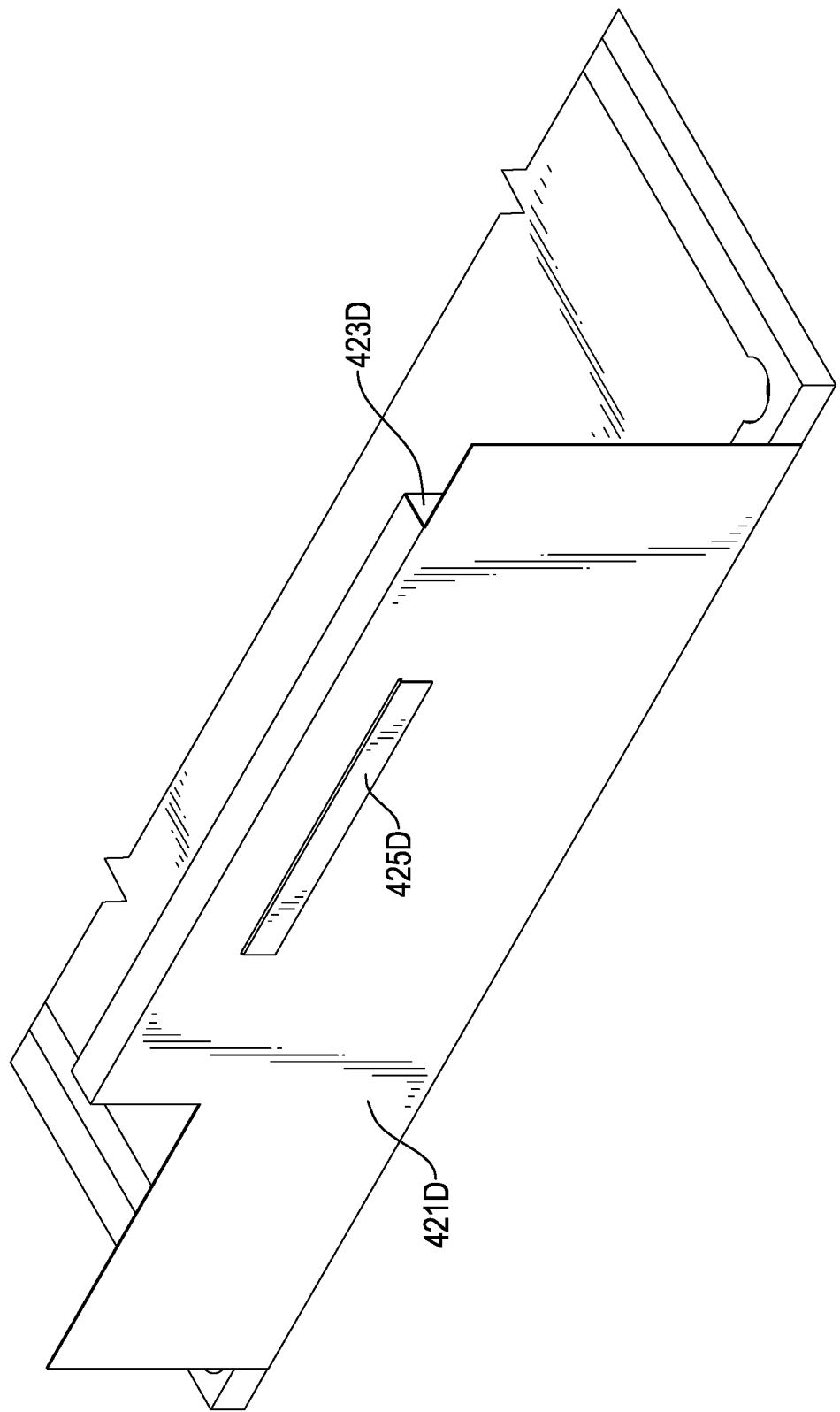
FIG. 14 is a partial perspective view of a wire securing assembly in accordance with the fifth embodiment in another angle.
Figure 15:
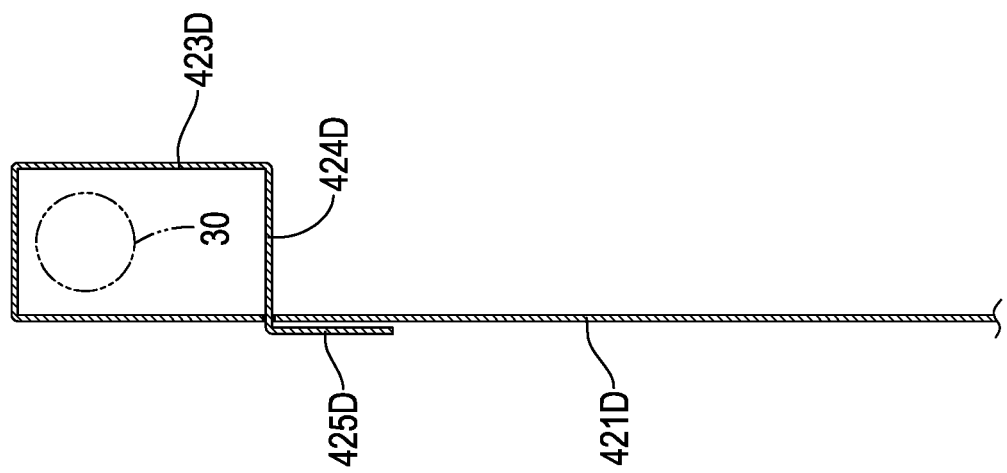
FIG. 15 is a sectional view of the wire securing assembly in accordance with the fifth embodiment.

Then please refer to FIG. 13 to FIG. 15. The fifth embodiment is similar to the fourth embodiment, but differences are that: in the fifth embodiment, the third plate 425D and the second plate 423D are located at different sides with respect to the first plate 421D. In other words, the first plate 421D is located between the second plate 423D and the third plate 425D. In this embodiment, the second connecting plate 424D penetrates through the first plate 421D.

Figure 16:
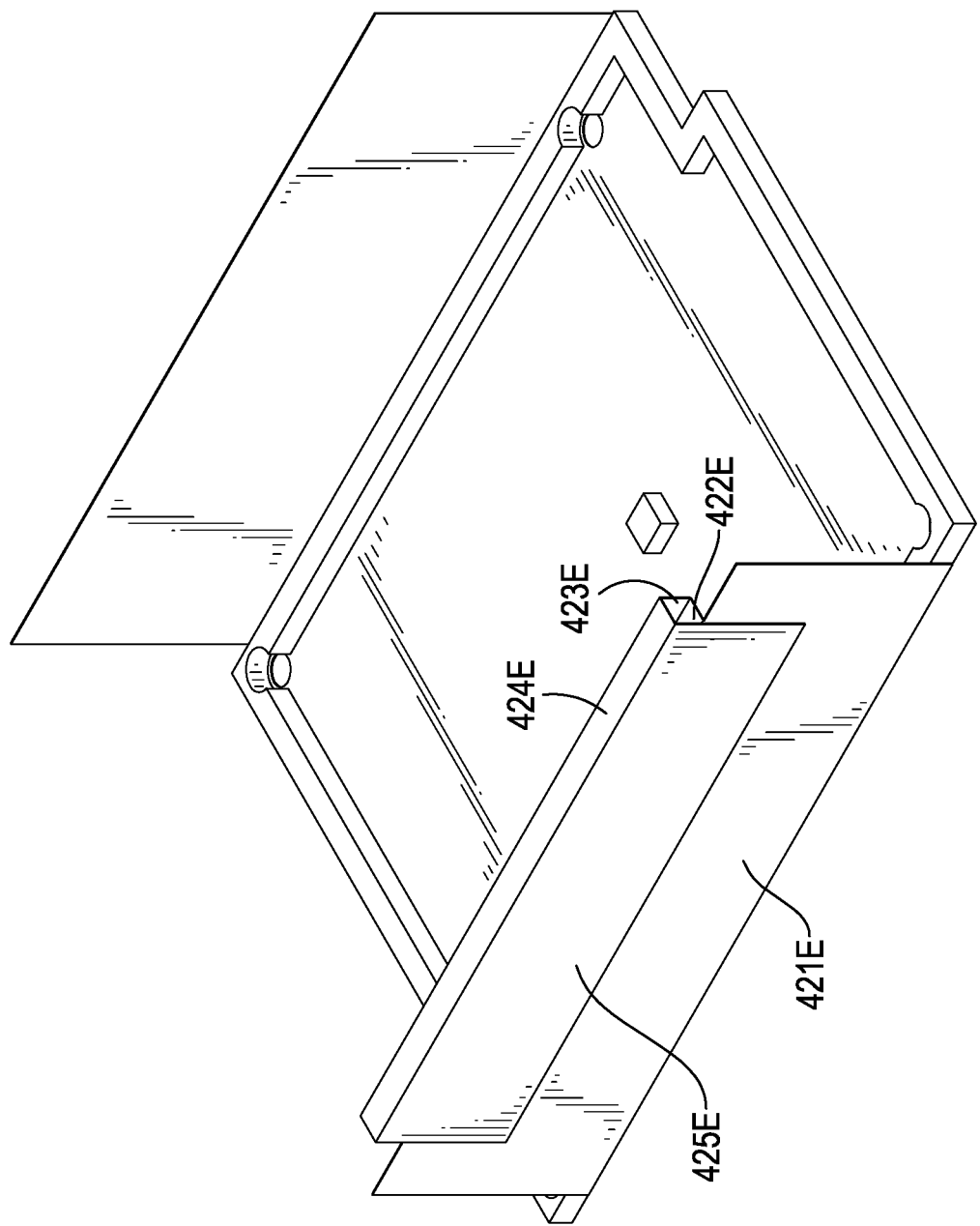
FIG. 16 is a partial perspective view of a wire securing assembly on the power supply in accordance with a sixth embodiment.
Figure 17:
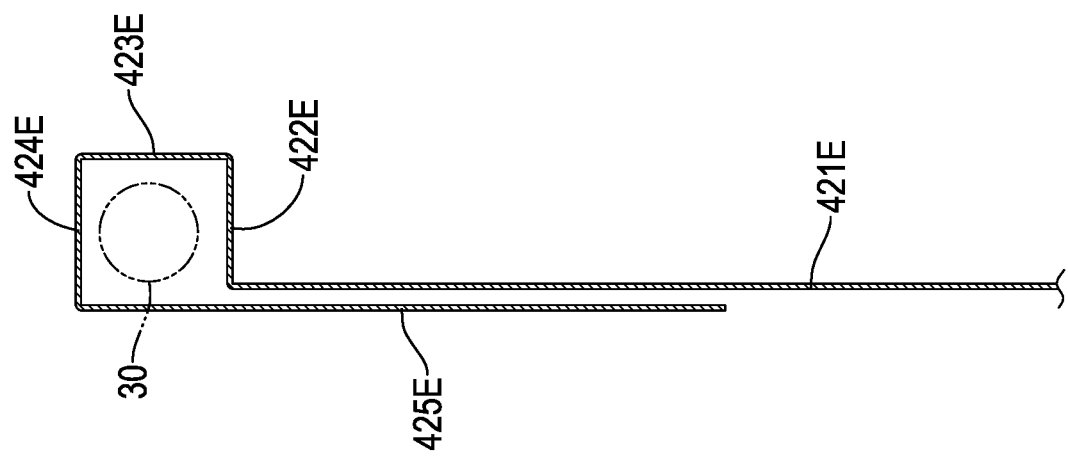
FIG. 17 is a sectional view of the wire securing assembly in accordance with the sixth embodiment.

Then please refer to FIG. 16 and FIG. 17. The sixth embodiment is similar to the fourth embodiment, but differences are that: in the sixth embodiment, the third plate 425E and the second plate 423E are located at different sides with respect to the first plate 421E. In other words, the first plate 421E is located between the second plate 423E and the third plate 425E. Another difference is: in the sixth embodiment, the second connecting plate 424E is located higher than the first connecting plate 422E. In this embodiment, a width of the third plate 425E may be larger than that of the second plate 423E. With such structure, a portion of the third plate 425E is capable of overlapping and attaching on the first plate 421E.

Figure 18:
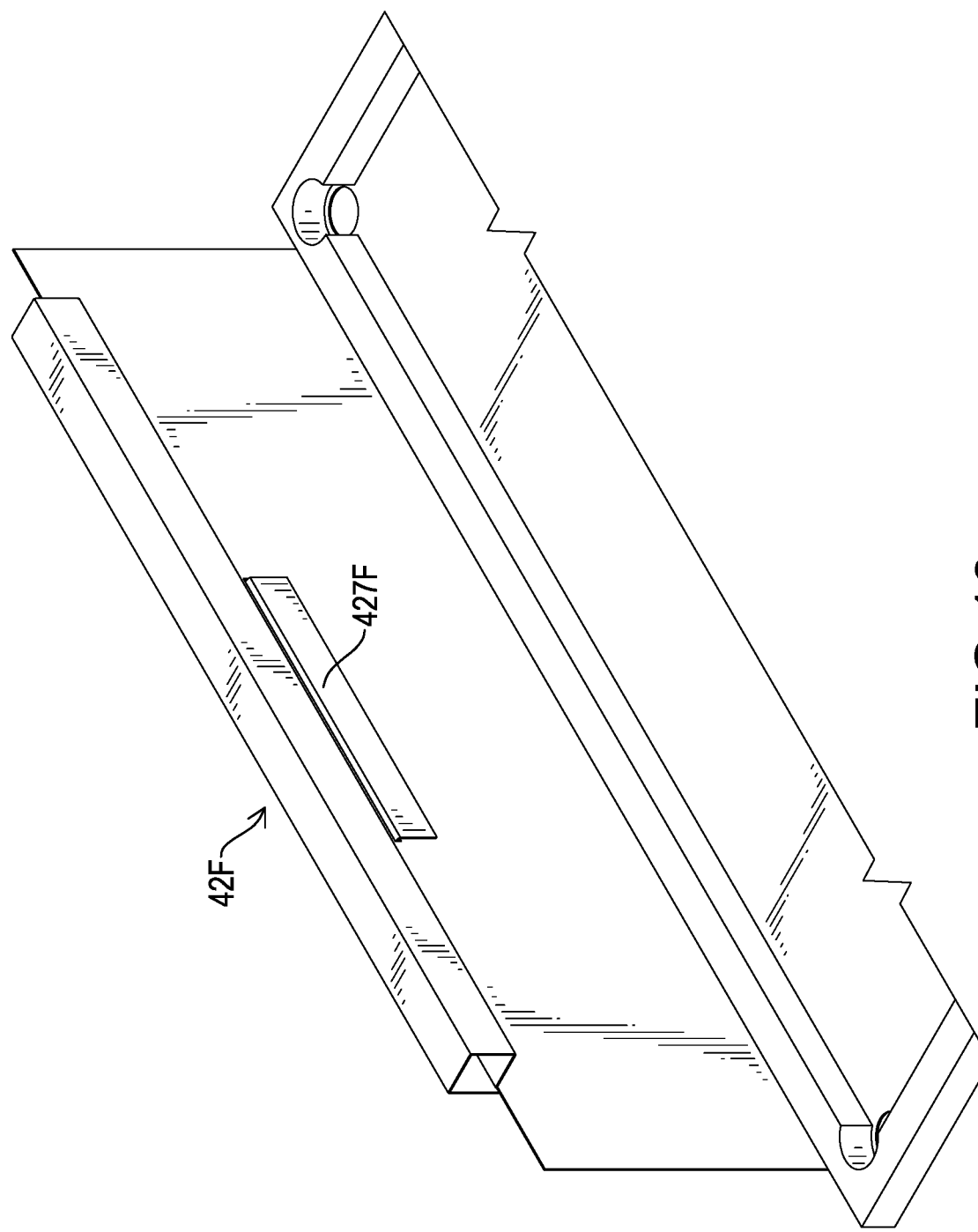
FIG. 18 is a partial perspective view of a wire securing assembly on the power supply in accordance with a seventh embodiment.
Figure 19:
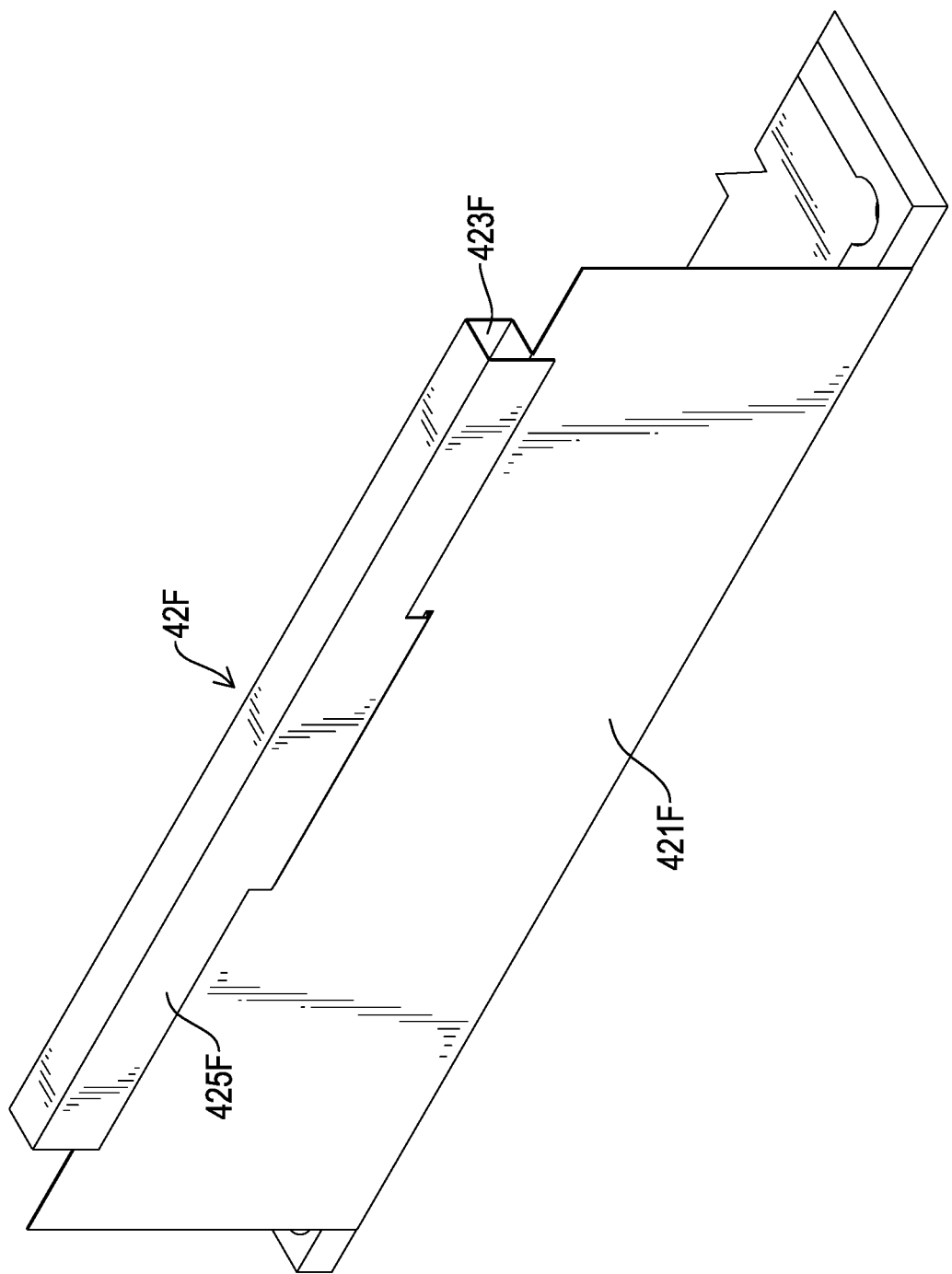
FIG. 19 is a partial perspective view of a wire securing assembly in accordance with the seventh embodiment in another angle.
Figure 20:
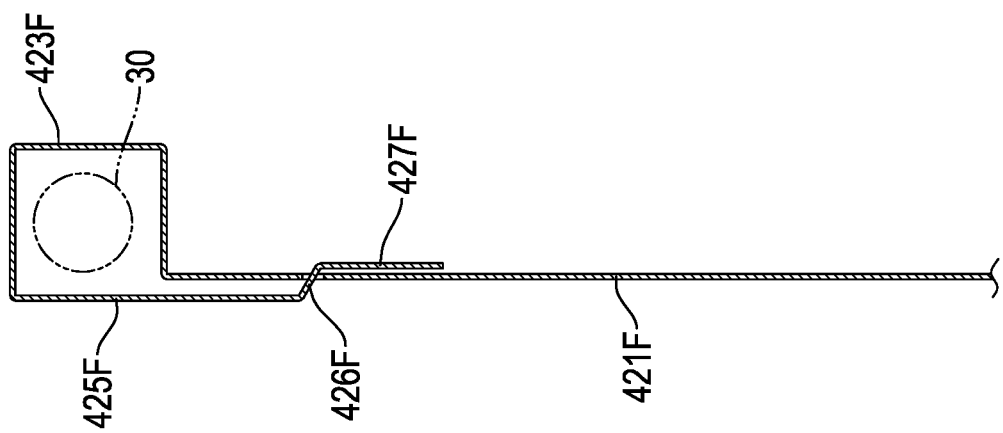
FIG. 20 is a sectional view of the wire securing assembly in accordance with the seventh embodiment.

Then please refer to FIG. 18 to FIG. 20. The seventh embodiment is similar to the fourth embodiment, but differences are that: in the seventh embodiment, the securing structure 42F further comprises a fourth plate 427F. The first plate 421F is parallel to and spaced apart from each other, and the fourth plate 427F and the second plate 423F are located at the same side with respect to the first plate 421F. In other words, the fourth plate 427F and the third plate 425F are located at different sides with respect to the first plate 421F. A distance between the fourth plate 427F and the first plate 421F is smaller than a distance between the second plate 423F and the first plate 421F, and is also smaller than a distance between the third plate 425F and the first plate 421F. Another difference is: in the seventh embodiment, the securing structure 42F may comprise a third connecting plate 426F. The third connecting plate 426F is mounted through the first plate 421F and connects the third plate 425F and the fourth plate 427F. The fourth plate 427F may downward extend from the third connecting plate 426F and is parallel to the first plate 421F. It is not limited thereto; in another embodiment, the fourth plate 427F upward extends from the third connecting plate 426F and is parallel to the first plate 421F.

Figure 21:
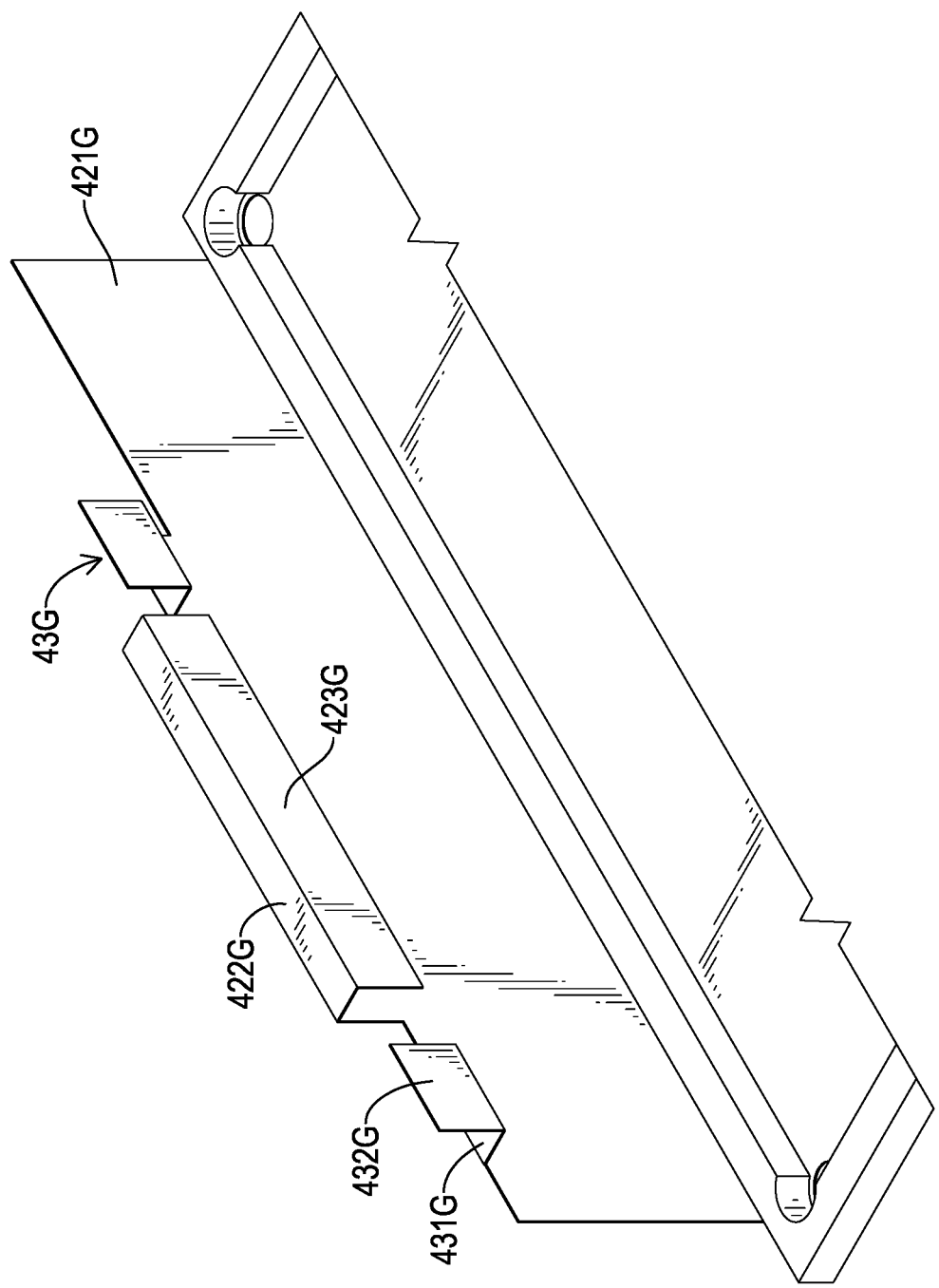
FIG. 21 is a partial perspective view of a wire securing assembly in accordance with an eighth embodiment in another angle.

Then please refer to FIG. 21 to FIG. 23. The eighth embodiment is similar to the first embodiment, but differences are that: in the eighth embodiment, the insulating part may further comprise at least one positioning sheet 43G. The positioning sheet 43G may be made by a tab extending from the second side edge of the first plate 421G. Precisely, the tab is bent or folded into a desired shape and thus forms the positioning sheet 43G. However, in another embodiment, a middle portion of the first plate 421G may be cut and then bent to form the positioning sheet 43G. Each one of the positioning sheets 43G may include a first section 431G and a second section 432G. A side edge of the first section 431G is connected to the first plate 421G, for example, the second side edge of the first plate 421G. The first section 431G may be parallel to the first connecting plate. A side edge of the second section 432G is connected to a side edge of the first section 431G, the side edge of the first section 431G opposite the first plate 421G. The second section 432G may be parallel to the second plate 423G. A distance between the second section 432G and the first plate 421G may be equal to a distance between the second plate 423G and the first plate 421G.

In this embodiment, the second section 432G extends from the first section 431G in a first direction. The first direction is a direction away from the base plate 41 and, precisely may be parallel to a direction from the first section 431G to the first connecting plate 422G. The second plate 423G extends from the first connecting plate 422G in a second direction. The second direction extends in a direction reverse to the first direction, i.e. a direction toward the base plate 41. However, in another embodiment, the extending direction of the second section 432G may be contrary to the aforesaid configuration, and the extending direction of the second plate 423G may be also contrary to the aforesaid configuration. This embodiment comprises two aforesaid positioning sheets 43G, and the second plate 423G is located between the two positioning sheets 43G. The wire 30 is mounted through and between the first section 431G and the first connecting plate 422G, and between the second section 432G and the second plate 423G.

Consequently, in the embodiments mentioned above, the current insulating part for bearing the circuit board and fan of the power supply is modified, the original side plate extends and forms an additional part, or a bent structure is added on the original side plate, and thus the additional structures become the securing structure 42 for securing the wire 30. Therefore, the wire 30 only can be displaced within the space enclosed by the securing structure 42, which prevents the wire 30 from moving under vibration or external force and contacting the blades of the fan or keeps the wire 30 in a position in compliance with safety requirements.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A wire securing assembly for a power supply, comprising:
    an insulating part, comprising:
        a base plate; and
        a securing assembly, comprising:
            a first plate, comprising a first side edge and a second side edge opposite to the first side edge, wherein the first side edge is connected to the base plate;
            a second plate, being parallel to and spaced apart from the first plate; wherein the second plate comprises a third side edge and a fourth side edge opposite to the third side edge;
            a first connecting plate, wherein two opposite side edges of the first connecting plate are connected t second side edge of the first plate and the third side edge of the second plate, respectively; and
            a second connecting, being plate parallel to and spaced apart from the first connecting plate, wherein the second connecting plate is connected to the fourth side edge of the second plate;
    wherein a wire is mounted through and between the first plate, the second plate, the first connecting plate, and the second connecting plate.

2. The wire securing assembly as claimed in claim 1, wherein the securing assembly comprises:
    a third plate parallel to the first plate, wherein a distance between the third plate and the first plate is smaller than a distance between the second plate and the first plate, and the third plate and the second plate are located at a same side with respect to the first plate; a side edge of the third plate is connected to a side edge of the second connecting plate that is opposite to the second plate.

3. The wire securing assembly as claimed in claim 1, wherein the securing structure comprises:
a third plate parallel to the first plate, wherein a distance between the third plate and the first plate is smaller than a distance between the second plate and the first plate, and the third plate and the second plate are located at different sides with respect to the first plate; a side edge of the third plate is connected to a side edge of the second connecting plate that is opposite to the second plate.

4. The wire securing assembly as claimed in claim 3, wherein the second connecting plate penetrates through the first plate.

5. The wire securing assembly as claimed in claim 1, wherein the securing assembly comprises:
a third plate parallel to and spaced apart from the first plate, wherein the third plate and the second plate are located at different sides with respect to the first plate; a side edge of the third plate is connected to a side edge of the second connecting plate that is opposite to the second plate;
a fourth plate parallel to and spaced apart from the first plate, wherein the fourth plate and the second plate are located on a same side of the first plate, and a distance between the fourth plate and the first plate is smaller than a distance between the second plate and the first plate and smaller than a distance between the third plate and the first plate.

6. A wire securing assembly for a power supply, comprising:
an insulating part, comprising:
a base plate; and
a securing assembly, comprising:
a first plate, comprising a first side edge and a second side edge opposite to the first side edge, wherein the first side edge is connected to the base plate;
a second plate, being parallel to and spaced apart from the first plate;
a first connecting plate, where in two opposite side edges of the first connecting plate are connected to the second side edge of the first plate and a side edge of the second plate, respectively; and
at least one positioning sheet, each one of the at least one positioning sheet comprising:
a first section, a side edge of the first section being connected to the first plate;
wherein a wire is mounted through and between the first plate and the second plate, wherein the wire is mounted through and between the first section of the at least one positioning sheet and the first connecting plate.

7. The wire securing assembly as claimed in claim 6, wherein each one of the at least one positioning sheet includes:
a second section, a side edge of the second section being connected to a side edge of the first section that is opposite to the first plate, wherein the side edge of the first section is arranged in parallel with the second plate.

8. The wire securing assembly as claimed in claim 7, wherein:
the second section extends from the first section in a first direction, the first direction being parallel to a direction from the first section to the first connecting plate; and
the second plate extends from the first connecting plate in a second direction, the second direction is opposite to the first direction.

9. A power supply comprising:
a housing;
a circuit board securely mounted on the housing;
a wire connected to the circuit board; and
an insulating part, comprising:
a base plate; and
a securing structure comprising:
a first plate, comprising a first side edge and a second side edge opposite to the first side edge, wherein the first side edge is connected to the base plate;
a second plate, being parallel to and spaced apart from the first plate; wherein the second plate comprises a third side edge and a fourth side edge opposite to the third side edge;
a first connecting plate, where two opposite side edges of the first connecting plate are connected to the second side edge of the first plate and the third side edge of the second plate, respectively; and
a second connecting, being plate parallel to and spaced apart from the first connecting plate, wherein the second connecting plate is connected to the fourth side edge of the second plate;
wherein the wire is mounted through and between the first plate, the second plate, the first connecting plate, and the second connecting plate.

* * * * *